United States Patent [19]

Tigges et al.

[11] Patent Number: 5,256,909
[45] Date of Patent: Oct. 26, 1993

[54] ELECTRONIC, PREFERABLY ZERO-CONTACT SWITCH

[75] Inventors: Burkhard Tigges, Balve; Herbert Sowa, Schwarzenberg, both of Fed. Rep. of Germany

[73] Assignee: Werner Turck GmbH & Co. KG, Halver, Fed. Rep. of Germany

[21] Appl. No.: 755,495

[22] Filed: Aug. 30, 1991

[30] Foreign Application Priority Data

Aug. 30, 1990 [DE] Fed. Rep. of Germany ....... 4027386

[51] Int. Cl.⁵ .................... H01H 35/00; H01H 36/00
[52] U.S. Cl. ................................. 307/116; 328/5; 307/308
[58] Field of Search ................ 307/116, 308–311; 361/179–181; 340/561, 562; 328/5

[56] References Cited

U.S. PATENT DOCUMENTS

| | | | |
|---|---|---|---|
| 4,135,124 | 1/1979 | Buck | 361/180 X |
| 4,199,694 | 4/1980 | Van Zeeland | 307/310 X |
| 4,329,730 | 5/1982 | Ryczek et al. | 361/100 |
| 4,414,478 | 11/1983 | Ueda et al. | 307/116 |
| 4,543,497 | 9/1985 | Buck et al. | 307/308 |
| 4,551,640 | 11/1985 | Fukuyama et al. | 307/311 X |
| 4,864,156 | 9/1989 | Tigges et al. | 307/117 |

FOREIGN PATENT DOCUMENTS

| | | |
|---|---|---|
| 0092711 | 11/1983 | European Pat. Off. |
| 3214836 | 2/1987 | Fed. Rep. of Germany |
| 8711035 | 9/1987 | Fed. Rep. of Germany |
| 3728008 | 2/1989 | Fed. Rep. of Germany |

OTHER PUBLICATIONS

Siemens Components, vol. 13, No. 5, Oct. 1, 1988, Berlin and Munich.

Primary Examiner—A. D. Pellinen
Assistant Examiner—Fritz M. Fleming
Attorney, Agent, or Firm—Antonelli, Terry, Stout & Kraus

[57] ABSTRACT

In an electronic switch, preferably operating with zero contact, an electronic load switch (3) is controlled by a sensor stage (1), with the switching elements being located in an IC circuit (200) between sensor stage (1) and load switch (3), said circuit (200) containing an inverter stage (7) which, when switched on and off, changes the operating mode of the switch from that of a "closer" to that of an "opener." To reduce the number of IC contacts required for this purpose, provision is made such that switch input (10) for turning on inverter stage (7) is connected inside the IC to IC output (27) of second driver stage (12) and that this IC output (27) is connectable to the operating potential to change the "opener" or "closer" operating mode through an IC-external short-circuit jumper (28).

9 Claims, 4 Drawing Sheets

ELECTRONIC, PREFERABLY ZERO-CONTACT SWITCH

BACKGROUND OF THE INVENTION

1. Field of the Invention

The invention relates to an electronic switch, preferably operating with zero contact, with an externally influenceable sensor stage, with an electronic load switch controllable by the sensor stage, and an integrated circuit (IC) provided between the sensor stage and the controlled input of the load switch. The integrated circuit comprising an evaluation stage for the sensor signal, a switchable inverter stage with switch input, and two driver stages operating in push-pull, with the output of the first driver stage controlling the load switch and the output of the second driver stage, in the "antivalent" mode, controlling another electronic switch.

2. Description of the Prior Art

Electronic switches of the type described above have replaced contact-encumbered, electrically or mechanically actuated switches in electrical measuring, control, or regulating circuits. This is especially true of electronic switches which respond with zero contact to a trigger, such as proximity switches. In proximity switches, in the presence of a trigger, the electrical properties of a sensor change, which sensor can be a dampable oscillator, a light barrier as an example of optical sensors, or, as another example, a gas detector. The electrical signals emitted by the sensor stage, usually preamplified, are fed to an evaluation stage whose digital output signal clearly determines for the following circuit stages whether the sensor stage has responded to a trigger or not. Depending on this signal, a load circuit is opened or closed by the following circuit stages, usually a driver stage and a load switch connected to it.

To avoid the cost of constructing electronic switches of the type described both as openers and as closers and to keep them in stock, the evaluation stage is followed by an inverter stage in which the digital output signal of the evaluation stage can be inverted as needed by applying a switching voltage to the special switching input of the inverter stage. By applying this switching voltage, a proximity switch with opener characteristics can be made from a proximity switch with closer characteristics (or vice versa).

In the course of miniaturization of electrical switches of the type described above, the evaluation stage, the switchable inverter stage, and the two driver stages that operate in push-pull are combined in an IC to save space. The space requirements of ICs basically reflect the number of their terminals, hereinbelow called IC contacts. In the known switch, one IC contact is required for applying the switching voltage to the inverter stage.

SUMMARY OF THE INVENTION

The goal of the invention is to reduce the number of IC contacts required in a switch having an IC circuit. The switch can be used for "closer," "opener," and "antivalent load switch" functions as described below.

According to the invention, this goal is achieved by virtue (1) the switch input of the inverter stage is connected with the IC to the second driver stage output, (2) the second driver stage output, for one of the operating modes as a "closer" or "opener," is maintained by an IC-internal voltage divider at a potential at which the inverter stage is switched off, and (3) the second driver stage output, for the other operating mode "opener" or "closer," is connectable by a short-circuiting bridge outside the IC to the operating potential to turn on the inverter stage.

By these means, a separate IC contact is eliminated for applying the switching voltage to turn on the inverter stage. Thus the IC can be built into a smaller IC housing, and the size of the circuit board in the switch can be reduced as well. On the other hand, it is also possible to use the now-free IC contact for other switching functions, for example for displays.

In order to be able to use the switch according to the invention in the "antivalent" operating mode as well, the functioning of the second driver stage, with the short-circuiting bridge removed, must remain present. For this purpose, it is proposed according to the invention that the voltage divider, which determines the potential at the switching input at the inverter stage, consists first of the current leakage resistance of the second driver stage and also the switchable constant current source of the second driver stage and an additional constant current source connected in parallel to the latter.

Since the switch input of the inverter stage of the "opener" mode is brought to the potential of the maximum operating voltage by conduction through the IC short circuit outside the bridge, after removing the short circuit bridge, the inverter stage may be shut off after removing from the second driver output stage any potential that is less than the operating potential. The current of the additional constant voltage source can be smaller by approximately two orders of magnitude than the current from the switchable driver stage constant current source.

To determine the potential of the second driver stage output, provision is made according to the invention for a diode chain to be connected in parallel with the current leakage resistance, which determines the maximum voltage drop at the current leakage resistance.

BRIEF DESCRIPTION OF THE DRAWINGS

The invention will now be described in greater detail with reference to a drawing.

DESCRIPTION OF THE PREFERRED EMBODIMENTS

Figure 1:
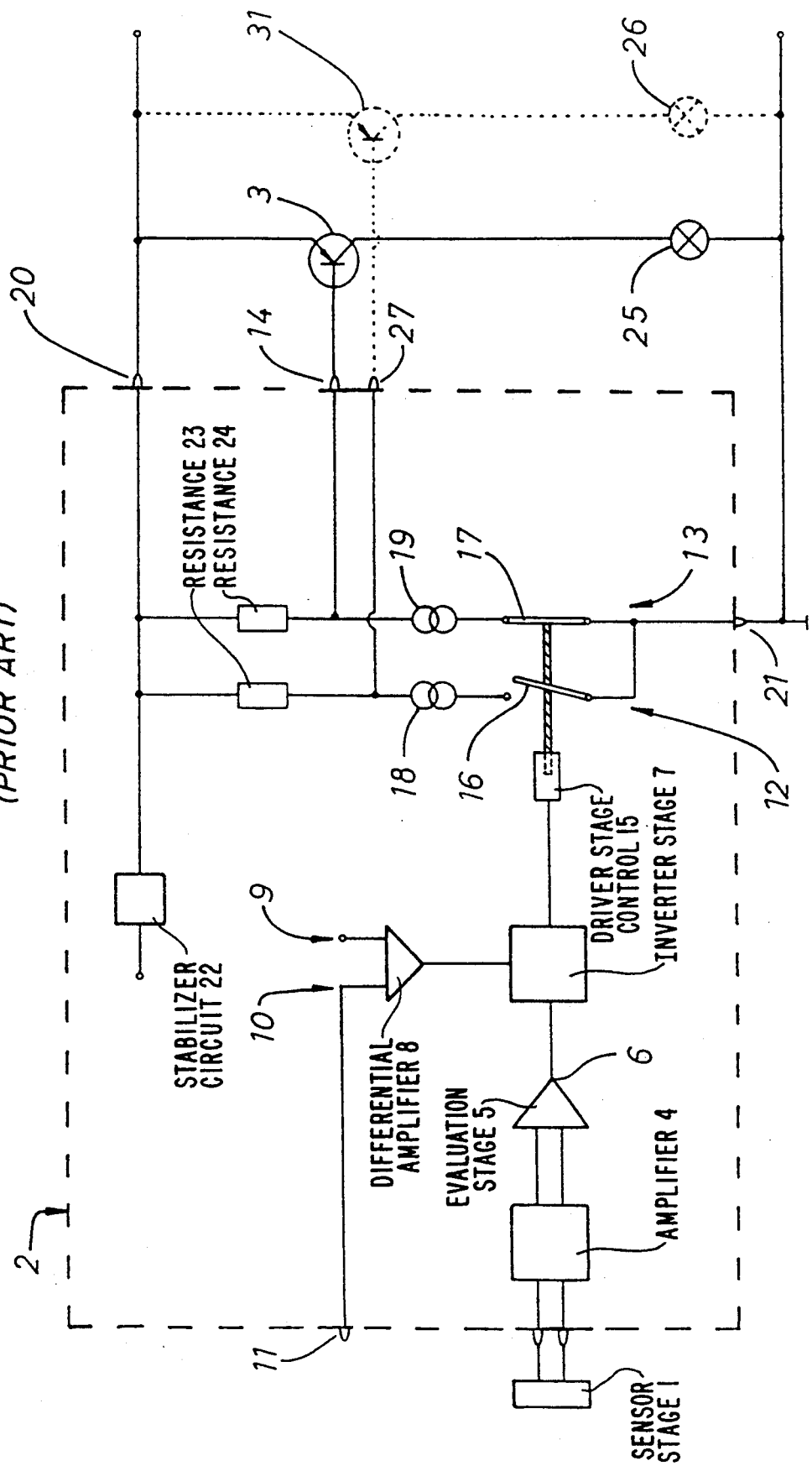
FIG. 1 is an electronic switch according to the prior art.

The known switch shown in FIG. 1 comprises a sensor stage 1 connected to an electronic circuit, essentially composed of an IC 2 an a load switch 3. Here a pnp transistor in the emitter circuit is provided as load switch 3, but another load switch could be used instead, as for example npn transistors, triacs or thyristors. The electrical signal delivered by sensor stage 1 is preamplified in amplifier 4 and fed to an evaluation stage 5. At output 6 of evaluation stage 5 signal level "l" or "h" is available in digital form corresponding to the amplified signal from the sensor stage. This digital signal is fed to a switchable inverter stage 7 which is switched on or off by a differential amplifier 8, which compares a reference voltage applied to its reference voltage input 9 with a switching voltage applied to comparison voltage input 10. To be able to change this switching voltage, the comparison voltage or switching input 10 of differential amplifier 8 is brought out from IC 2 to an IC contact 11.

The output signal of inverter stage 7 is applied through a driver stage control 15 to two driver stages 12, 13, with output 14 of first driver stage 13 controlling load switch 3 through its IC terminal. The function of driver stages 12, 13 corresponds to that of a light-duty relay, whose coupled contacts 16, 17 switch current supplies 18, 19 on and off, with load switch 3 or load switch 31 indicated by dashed lines being addressed. Components 15 to 19 shown are to be understood only as functional symbols here. They take the form of electronic circuits connected by IC contacts 20 and 21 to the operating voltage, with stabilizer circuit 22 stabilizing the applied IC-internal operating voltage and also supplying the reference voltage for differential amplifier 8.

When no voltage is applied to IC contact 11, inverter stage 7 is disconnected functionally. If sensor stage 1 is not triggered, signal level "l" appears at output 6 of evaluation stage 5 for example. This signal level is not affected by inverter stage 7. The input of driver stage control 15 is at level "l" and keeps switch contact 16 closed and switch contact 17 open. Output 14 of first driver stage 13 is placed at the plus potential of the operating voltage through resistor 24 and thus blocks the switching transistor of load switch 3. The bulb designated load 25 remains dark. When sensor stage 1 responds to a trigger, signal level "h" is applied to output 6 of evaluation stage 5, and unaffected by inverted stage 7, switches contacts 16 and 17 through driver stage control 15. When switch contact 17 is closed, resistor 24 and driver-current source 19 form a voltage divider between the operating voltage applied to IC contacts 20 and 21 and lower the potential applied to driver stage output 14 to the point where load switch 3 completes the circuit. Hence, it has a "closer" characteristic.

When a switching voltage is applied to IC contact 11, inverter stage 7 is switched on. If there is no trigger in the vicinity of sensor stage 1, signal "l" which appears at output 6 of evaluation stage 5 is converted by the switched-on inverter stage into "h." Consequently, contact 17 and load switch 3 are closed. When sensor stage 1 responds to a trigger, the signal of evaluation stage 5 switches to "h" and this is inverted by inverter stage 7 to "l," so that driver stage control 15 opens switch contact 17, and then load switch 3 opens as well.

Therefore, a closer may been turned into an opener by applying a switching voltage to IC contact 11.

When one load is to be switched on and a second load is to be switched off simultaneously by the proximity switch, the circuit is supplemented by the second load circuit indicated by the dashed lines with load switch 31 and load 26, and load switch 31 is connected to output 27 of second driver stage 12. Since the two driver stages 12 and 13 already operate in an antivalent fashion, load switches 3 and 31 are also wired in an antivalent fashion.

Figure 2:
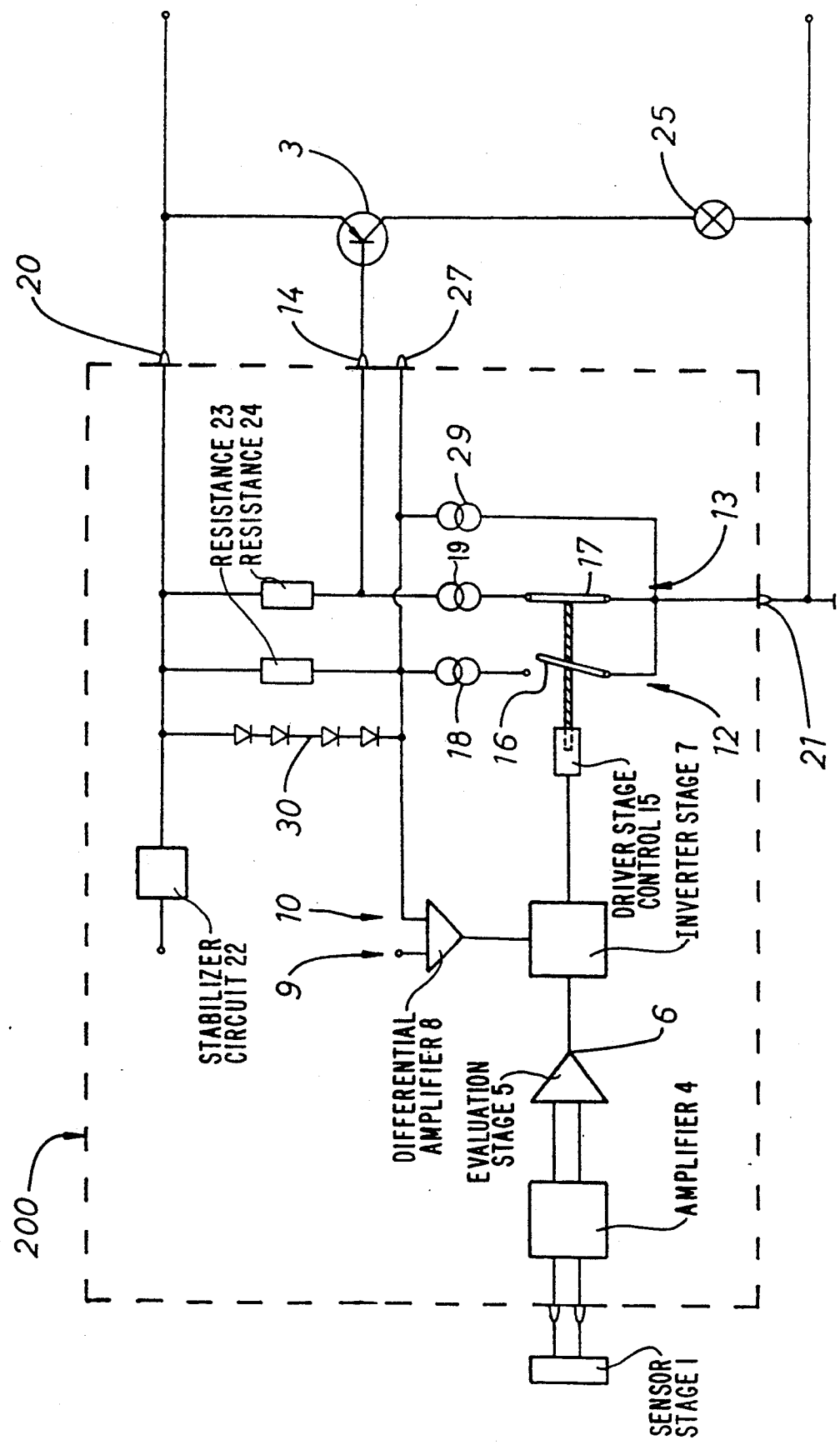
FIG. 2 is an electronic switch according to the invention designed as a closer.
Figure 3:
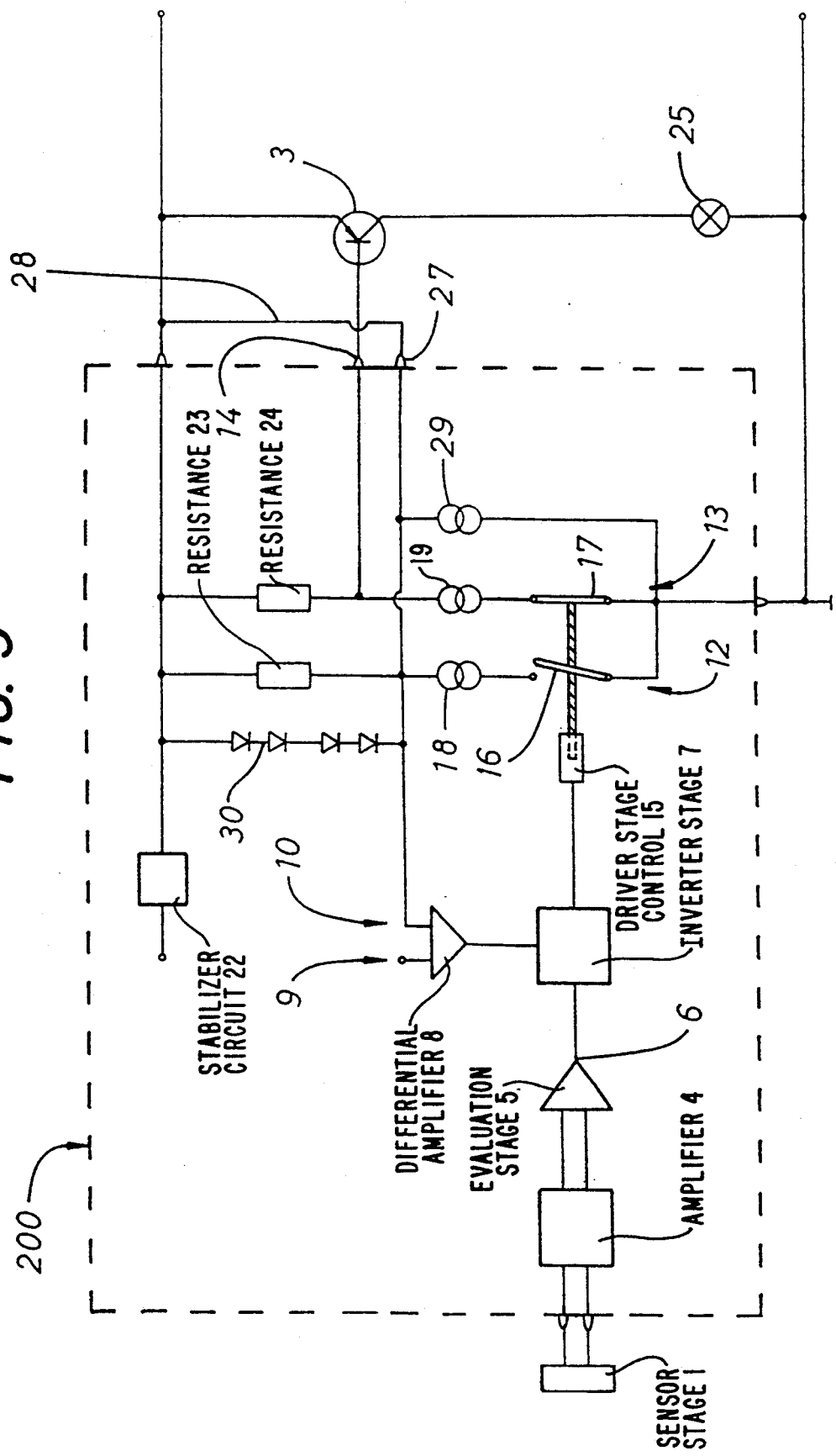
FIG. 3 is an electronic switch according to the invention designed as an opener.
Figure 4:
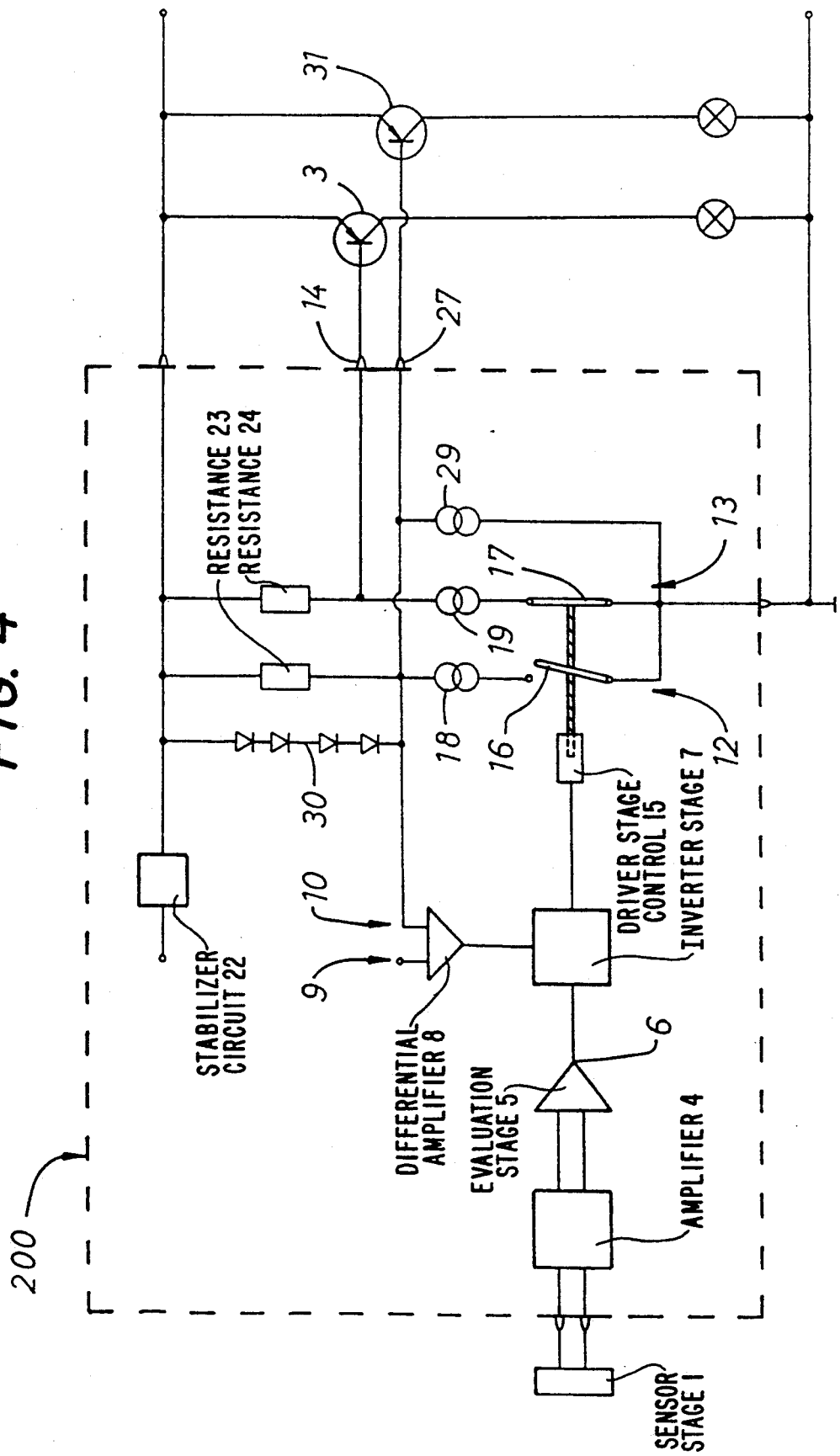
FIG. 4 is a switch according to the invention equipped with switches operating with antivalence.

In the switches according to the invention shown in FIG. 2 (closer), FIG. 3 (opener), and FIG. 4 (two load switches operating in push-pull or antivalent mode), a largely similar IC circuit 200 is used in which, however, in contrast to FIG. 1, circuit input 10 of inverter stage 7 is fed to the IC contact of output 27 of second driver stage 12. In addition, another constant current source 29 is connected in parallel with current source 18 and switch contact 16 of second driver stage 12. In addition, IC circuit 200 also contains a diode chain 30 in parallel with current leakage resistor 23 of second driver stage 12.

In the closer shown in FIG. 2, resistor 23 and diode chain 30 connected in parallel, together with current sources 18, 29 connected in parallel, form a voltage divider which drops the potential of driver stage output 27 of driver stage 12 relative to the potential of the positive operating voltage, so that differential amplifier 8 switches out inverter stage 7. When sensor stage 1 is triggered by a trigger, driver stage control 15 reverses switching contacts 16 and 17 so that switch contact 17 and load switch 3 are closed. Since switch contact 16 is then opened, comparison input 10 of differential amplifier 8 has a voltage applied to it that is generated by a voltage divider formed firstly by resistor 23 in a parallel circuit with diode chain 30 and secondly by additional constant current source 29. The resultant potential, which is higher than when switch 16 is closed, is not sufficient by comparison with differential amplifier 8 to the potential of the operating voltage to switch on inverter stage 7.

In the opener shown in FIG. 3, the IC contact of output 27 of second driver stage 12 is connected external of the IC 200 through a short-circuiting jumper 28 to the positive potential of the operating voltage. Independently of the switch position of switch contact 16 of driver stage 12 and independently of the additional circuit composed of constant current source 29 and diode chain 30, the potential applied at 27 or at comparison input 10 causes differential amplifier 8 to switch on inverter stage 7. With input signal "l" the inverter supplies output signal "h," thus causing switch contacts 16, 17 to reverse and close load switch 3. If sensor stage 1 reacts to a trigger, a signal "h" is applied to output 6 of evaluation stage 5 and is inverted by inverter 7 so that driver stage control 15 closes switch contact 16 and opens switch contact 17. Consequently, the base of the switching transistor of load switch 3 is connected to the plus potential of the operating voltage through resistor 24, so that load switch 3 opens.

As FIG. 4 shows, the closer shown in FIG. 2 can be converted by adding another load switch 31 to a switch with load switches 3 and 31 that operate in an antivalent fashion. For this it is necessary to generate two electrical states at output 27 of driver stage 12 in accordance with the position of switch contact 16 such that load switch 31, depending on its state, reliably closes or opens. This is achieved by selecting a very small current for additional constant current source 29 relative to the current from constant current source 18. This ensures that firstly, when switch contact 16 is closed, the control potential will be lowered to the point where load switch 31 reliably closes and secondly when contact 16 is open, the input potential of the comparator or differential amplifier 8 remains sufficiently low that the inverter stage remains disconnected.

When a sensor signal is present, in other words when switch contact 16 is open, the connection of current sources 18 is broken and as a result of the smaller current from constant current source 29, the potential at output 27 of driver stage 12 is elevated relative to the closed state of switch contact 16 to the point where load switch 31 reliably opens. On the other hand, this increase in potential does not reach the level required to switch inverter stage 7.

The terms "opener" and "closer" used in the specification to characterize the switching behavior of the load switch follow from the application of the load switch to a special transistor circuit, the application of switching level "1" at output 6 of evaluation stage 5, and the setting of the basic position of switch contact 16. By altering one or more settings, the switch can be designed so that it operates without short-circuit jumper 28 as an "opener" and after the short-circuit jumper closes, as a "closer."

REFERENCE NUMBERS

1 Sensor stage
2 IC
3 Load switch
4 Amplifier
5 Evaluation stage
6 Output
7 Inverter stage
8 Differential amplifier
9 Reference voltage input
10 Switch input
11 IC contact
12 Second driver stage
13 First driver stage
14 Driver stage output
15 Driver stage control
16 Switch contact
17 Switch contact
18 Current source
19 Current source
20 IC contact
21 IC contact
22 Stabilizer circuit
23 Resistance
24 Resistance
25 Load
26 Load
27 Driver stage output
28 Short-circuit jumper
29 Constant current source
30 Diode chain
31 Load switch
200 IC circuit

We claim:

1. An electronic zero contact switch for use in opening, closing or antivalent modes comprising:
   a sensor stage;
   a first load switch controllable in response to a sensed state of the sensor stage; and
   an IC coupling the sensor stage to the first load switch including an evaluation stage coupled to the sensor stage with the evaluation stage having an output which provides an input signal to an inverter, the inverter being responsive to a control signal having first and second states controlling whether an output signal of the inverter is an inversion of the input signal to the inverter, a first driver stage having an input coupled to the output of the inverter which produces an output signal at a first output terminal of the IC, a control signal source producing the control signal having an input connected to an output of a second driver stage and the control signal source changing the state of the control signal in response to an output signal from the second driver stage and having an output coupled to a control input of the inverter and the second driver stage having an input coupled to the output of the inverter which produces an output signal at a second output terminal of the IC with the output signals from the first and second driver stages having opposite states; and
   an output signal from one of the first and second output terminals is coupled to the first load switch and controls the first load switch.

2. An electronic zero contact switch in accordance with claim 1 further comprising:
   a voltage divider within the IC and having a first and a second IC terminal which IC terminals during operation of the zero contact switch are at different potentials with the output from the second driver stage being connected to the voltage divider within the IC.

3. An electronic zero contact switch in accordance with claim 2 wherein the voltage divider comprises:
   a first parallel circuit having a first connection connected to the first IC terminal and a second connection connected to the output of the second driver stage and comprising at least one diode in parallel with a first resistance; and
   a constant current source having a first connection connected to the output of the second driver stage and a second connection connected to the second IC terminal.

4. An electronic zero contact switch in accordance with claim 3 further comprising:
   a second resistance having a connection connected to the first IC terminal and a second connection connected to the output of the first driver stage.

5. An electronic zero contact switch in accordance with claim 4 wherein:
   the first driver stage comprises a switch in series with a constant current source coupled between the second IC terminal and the second connection of the second resistance; and
   the second driver stage comprises another switch in series with another constant current source coupled between the second IC terminal and the second connection of the first parallel circuit.

6. An electronic zero contact switch in accordance with claim 1 wherein:
   the first load switch is connected to the first output terminal of the IC and further comprising;
   a second load switch connected to the second IC output terminal of the IC.

7. An electronic zero contact switch in accordance with claim 2 further comprising:
   a short circuiting jumper connected between the first IC terminal and the second output terminal of the IC.

8. An electronic zero contact switch in accordance with claim 3 further comprising:
   a short circuiting jumper connected between the first IC terminal and the second output terminal of the IC.

9. An electronic zero contact switch in accordance with claim 4 further comprising:
   a short circuiting jumper connected between the first IC terminal and the second output terminal of the IC.

* * * * *